US010180829B2

United States Patent
Burlacu-Zane et al.

(10) Patent No.: US 10,180,829 B2
(45) Date of Patent: Jan. 15, 2019

(54) SYSTEM AND METHOD FOR MODULO ADDRESSING VECTORIZATION WITH INVARIANT CODE MOTION

(71) Applicant: FREESCALE SEMICONDUCTOR, INC., Austin, TX (US)

(72) Inventors: Anca Gabriela Burlacu-Zane, Bucuresti (RO); Abderrazek Zaafrani, Round Rock, TX (US)

(73) Assignee: NXP USA, Inc., Austin, TX (US)

( * ) Notice: Subject to any disclaimer, the term of this patent is extended or adjusted under 35 U.S.C. 154(b) by 67 days.

(21) Appl. No.: 15/088,346

(22) Filed: Apr. 1, 2016

(65) Prior Publication Data

US 2017/0168745 A1     Jun. 15, 2017

(30) Foreign Application Priority Data

Dec. 15, 2015   (RO) ................ A201501009

(51) Int. Cl.
*G06F 9/312*     (2018.01)
*G06F 9/44*      (2018.01)
(Continued)

(52) U.S. Cl.
CPC ............ *G06F 8/4441* (2013.01); *G06F 8/433* (2013.01); *G06F 8/452* (2013.01); *G06F 8/425* (2013.01);
(Continued)

(58) Field of Classification Search
CPC ............ G06F 9/30043; G06F 9/30181; G06F 9/30036; G06F 9/3897; G06F 9/3834;
(Continued)

(56) References Cited

U.S. PATENT DOCUMENTS 4,796,179 A *  1/1989 Lehman ............... G06F 8/30
                                                    700/86
4,935,867 A *  6/1990 Wang ................. G06F 9/3552
                                                    708/491
(Continued)

FOREIGN PATENT DOCUMENTS

EP          1039370 B1      10/2005

OTHER PUBLICATIONS

Paul Colea, Generalizing Loop-Invariant Code Motion in a Real-World Compiler, Jun. 2015, [Retrieved on Mar. 8, 2018]. Retrieved from the internet: <URL: https://www.doc.ic.ac.uk/teaching/distinguished-projects/2015/p.colea.pdf> 89 Pages (1-82) (Year: 2015).*

(Continued)

*Primary Examiner* — Anibal Rivera

(57) ABSTRACT

A processing device includes a target processor instruction memory to store a plurality of memory access instructions, and a compiler. A vector invariant candidate detection module of the compiler to determine whether the memory access instruction is to be replaced by vector invariant access code, and in response: the complier to generate first replacement code that vectorizes the memory access instruction using vector invariant access code, and to replace the memory access instruction with the first replacement code. A vector modulo addressing candidate detection module of the compiler to determine whether the memory access instruction is to be replaced by vector modulo addressing access code, and in response: the compiler to generate second replacement code that vectorizes the memory access instruction using vector modulo addressing code, and to replace the memory access instruction with the second replacement code.

17 Claims, 6 Drawing Sheets

(51) Int. Cl.
*G06F 9/30* (2018.01)
*G06F 17/50* (2006.01)
*G06F 8/41* (2018.01)
*G06F 9/355* (2018.01)
*G06F 9/455* (2018.01)
*G06F 11/36* (2006.01)

(52) U.S. Cl.
CPC .......... *G06F 8/441* (2013.01); *G06F 9/30043* (2013.01); *G06F 9/3552* (2013.01); *G06F 9/4552* (2013.01); *G06F 11/3636* (2013.01); *G06F 17/5022* (2013.01)

(58) Field of Classification Search
CPC ...... G06F 9/4552; G06F 9/488; G06F 9/3552; G06F 9/3001; G06F 9/30145; G06F 9/30101; G06F 9/30014; G06F 9/355; G06F 9/345; G06F 9/30032; G06F 9/30058; G06F 9/3009; G06F 11/3636; G06F 11/3608; G06F 11/1004; G06F 8/452; G06F 8/441; G06F 8/4434; G06F 8/4552; G06F 8/447; G06F 8/4441; G06F 8/30; G06F 8/443; G06F 8/425; G06F 8/433; G06F 8/4442; G06F 17/5022; G06F 17/10; G06F 17/30982; G06F 17/5068; G06F 17/15; G06F 8/451; G06F 9/30109; G06F 8/4452; G06F 9/30094
See application file for complete search history.

(56) References Cited

U.S. PATENT DOCUMENTS

| | | | | |
|---|---|---|---|---|
| 4,991,088 A * | 2/1991 | Kam | G06F 8/4442 | 711/133 |
| 5,123,095 A * | 6/1992 | Papadopoulos | G06F 9/30032 | 708/520 |
| 5,134,695 A * | 7/1992 | Ikeda | G06F 9/3455 | 711/5 |
| 5,457,799 A * | 10/1995 | Srivastava | G06F 8/443 | 717/160 |
| 5,483,597 A * | 1/1996 | Stern | G06Q 20/341 | 380/30 |
| 5,537,606 A * | 7/1996 | Byrne | G06F 9/30109 | 711/169 |
| 5,537,620 A * | 7/1996 | Breternitz, Jr. | G06F 8/443 | 717/150 |
| 5,603,012 A * | 2/1997 | Sotheran | G06F 9/3867 | 712/208 |
| 5,606,520 A * | 2/1997 | Gove | G06F 12/0284 | 708/491 |
| 5,649,146 A * | 7/1997 | Riou | G06F 5/10 | 711/1 |
| 5,659,700 A * | 8/1997 | Chen | G06F 5/10 | 711/213 |
| 5,727,130 A * | 3/1998 | Hung | G06K 9/6262 | 382/155 |
| 5,790,443 A * | 8/1998 | Shen | G06F 7/509 | 708/491 |
| 5,802,375 A * | 9/1998 | Ngo | G06F 8/452 | 717/150 |
| 5,815,698 A * | 9/1998 | Holmann | G06F 9/30058 | 712/237 |
| 5,924,114 A * | 7/1999 | Maruyama | G06F 9/3552 | 711/110 |
| 5,956,757 A * | 9/1999 | Sun | G06F 9/355 | 360/49 |
| 5,958,048 A * | 9/1999 | Babaian | G06F 8/441 | 712/241 |
| 5,963,739 A * | 10/1999 | Homeier | G06F 11/3608 | 714/E11.209 |
| 6,016,397 A * | 1/2000 | Ogasawara | G06F 8/452 | 717/160 |
| 6,047,364 A * | 4/2000 | Kolagotla | G06F 5/10 | 711/211 |
| 6,049,858 A * | 4/2000 | Kolagotla | G06F 5/10 | 711/217 |
| 6,052,768 A * | 4/2000 | Rim | G06F 9/3552 | 711/217 |
| 6,072,830 A * | 6/2000 | Proctor | G06T 9/008 | 375/240.22 |
| 6,078,475 A * | 6/2000 | Lawson | F16C 17/08 | 360/265.2 |
| 6,078,745 A * | 6/2000 | De Greef | G06F 8/4434 | 717/151 |
| 6,106,575 A * | 8/2000 | Hardwick | G06F 8/45 | 712/229 |
| 6,148,439 A * | 11/2000 | Nishiyama | G06F 8/4442 | 711/213 |
| 6,292,822 B1* | 9/2001 | Hardwick | G06F 8/451 | 718/102 |
| 6,363,470 B1* | 3/2002 | Laurenti | G06F 5/01 | 710/56 |
| 6,453,405 B1* | 9/2002 | Hoyle | G06F 9/30036 | 711/110 |
| 6,463,518 B1* | 10/2002 | Duboc | G06F 9/30043 | 711/220 |
| 6,539,467 B1* | 3/2003 | Anderson | G06F 9/30014 | 711/149 |
| 6,550,000 B1* | 4/2003 | Minematsu | G06F 9/30094 | 712/215 |
| 6,558,578 B2* | 5/2003 | Ducros | H01B 1/20 | 252/500 |
| 6,584,556 B1* | 6/2003 | Witt | G06F 9/3001 | 711/110 |
| 6,704,834 B1* | 3/2004 | Demeure | G06F 12/0207 | 711/202 |
| 6,748,589 B1* | 6/2004 | Johnson | G06F 9/30065 | 717/150 |
| 7,086,046 B2* | 8/2006 | Barsness | G06F 8/443 | 717/109 |
| 7,107,436 B2* | 9/2006 | Moyer | G06F 9/30043 | 712/22 |
| 7,275,148 B2* | 9/2007 | Moyer | G06F 9/30043 | 712/22 |
| 7,386,842 B2* | 6/2008 | Eichenberger | G06F 8/4452 | 717/150 |
| 7,395,531 B2* | 7/2008 | Eichenberger | G06F 8/447 | 712/22 |
| 7,447,886 B2* | 11/2008 | Lee | G06F 9/30181 | 712/230 |
| 8,694,947 B1* | 4/2014 | Venkataramani | G06F 17/5045 | 716/113 |
| 8,863,069 B1* | 10/2014 | Venkataramani | G06F 17/5045 | 716/100 |
| 9,489,180 B1* | 11/2016 | Baskaran | G06F 8/447 | |
| 9,785,413 B2* | 10/2017 | Schuchman | G06F 8/4441 | |
| 2002/0118730 A1* | 8/2002 | Svensson | G06F 17/15 | 375/150 |
| 2002/0124039 A1* | 9/2002 | Inoue | G06F 5/10 | 708/670 |
| 2002/0194452 A1* | 12/2002 | Catherwood | G06F 7/72 | 711/220 |
| 2003/0023961 A1* | 1/2003 | Barsness | G06F 8/443 | 717/152 |
| 2003/0105917 A1* | 6/2003 | Ostler | G06F 7/5055 | 711/110 |
| 2003/0115579 A1* | 6/2003 | Archambault | G06F 8/4441 | 717/152 |
| 2003/0212876 A1* | 11/2003 | Chung | G06F 9/30018 | 711/220 |
| 2003/0237080 A1* | 12/2003 | Thompson | G06F 8/441 | 717/161 |
| 2004/0000667 A1* | 1/2004 | Baniecki | H01L 28/55 | 257/66 |
| 2004/0019770 A1* | 1/2004 | Kawahito | G06F 8/4441 | 712/227 |

(56) References Cited

U.S. PATENT DOCUMENTS

| | | | |
|---|---|---|---|
| 2004/0025150 A1* | 2/2004 | Heishi | G06F 8/425 717/154 |
| 2005/0097301 A1* | 5/2005 | Ben-David | G06F 8/41 712/22 |
| 2005/0108499 A1* | 5/2005 | Huang | G06F 8/41 711/217 |
| 2005/0166036 A1* | 7/2005 | Catherwood | G06F 9/30145 712/34 |
| 2005/0273450 A1* | 12/2005 | McMillen | G06K 9/00973 |
| 2005/0283589 A1* | 12/2005 | Matsuo | G06F 9/30101 712/217 |
| 2005/0283775 A1* | 12/2005 | Eichenberger | G06F 8/445 717/151 |
| 2006/0004996 A1* | 1/2006 | Gonion | G06F 8/441 712/241 |
| 2006/0048122 A1* | 3/2006 | Barton | G06F 8/443 717/160 |
| 2006/0282807 A1* | 12/2006 | Ivancic | G06F 11/3608 716/106 |
| 2006/0288334 A1* | 12/2006 | Tian | G06F 8/4441 717/127 |
| 2007/0011441 A1* | 1/2007 | Eichenberger | G06F 9/30032 712/221 |
| 2007/0083730 A1* | 4/2007 | Vorbach | G06F 9/3897 712/10 |
| 2007/0124722 A1* | 5/2007 | Gschwind | G06F 8/445 717/106 |
| 2007/0226453 A1* | 9/2007 | Eichenberger | G06F 9/30036 712/6 |
| 2007/0256432 A1* | 11/2007 | Zugibe | F25B 43/02 62/115 |
| 2009/0080528 A1* | 3/2009 | Shiue | H04N 19/52 375/240.16 |
| 2010/0005254 A1* | 1/2010 | Cooke | G06K 9/6276 711/156 |
| 2010/0138633 A1* | 6/2010 | Cooke | G06F 9/30032 712/17 |
| 2010/0318752 A1* | 12/2010 | Schwarz | G06F 12/0292 711/154 |
| 2011/0041178 A1* | 2/2011 | Jakobsson | G06F 21/566 726/22 |
| 2011/0138373 A1* | 6/2011 | Lane | G06F 8/443 717/157 |
| 2011/0238948 A1* | 9/2011 | Vorbach | G06F 15/7867 712/15 |
| 2011/0296146 A1* | 12/2011 | Anand | G06F 9/3001 712/222 |
| 2012/0017185 A1* | 1/2012 | Padmanabhan | G06F 17/5022 716/104 |
| 2012/0039463 A1* | 2/2012 | Gentry | H04L 9/008 380/28 |
| 2012/0041608 A1* | 2/2012 | Zugibe | G06F 17/5068 700/285 |
| 2012/0117552 A1* | 5/2012 | Krishnaiyer | G06F 8/4441 717/160 |
| 2012/0131309 A1* | 5/2012 | Johnson | G06F 9/30 712/41 |
| 2012/0148110 A1* | 6/2012 | Chen | H04N 7/0137 382/107 |
| 2012/0166765 A1* | 6/2012 | Gonion | G06F 8/4441 712/200 |
| 2013/0024848 A1* | 1/2013 | Bhaskaracharya | G06F 8/443 717/147 |
| 2013/0024933 A1* | 1/2013 | Jakobsson | G06F 21/567 726/22 |
| 2013/0024936 A1* | 1/2013 | Jakobsson | G06F 21/554 726/23 |
| 2013/0117344 A1* | 5/2013 | Gross | G06F 17/10 708/490 |
| 2013/0159618 A1* | 6/2013 | Cooke | G06F 17/30982 711/108 |
| 2013/0185703 A1* | 7/2013 | Davis | G06F 8/41 717/140 |
| 2013/0205286 A1* | 8/2013 | Barraclough | G06F 8/443 717/151 |
| 2013/0305020 A1* | 11/2013 | Valentine | G06F 9/3001 712/208 |
| 2013/0318511 A1* | 11/2013 | Tian | G06F 8/447 717/157 |
| 2014/0063915 A1* | 3/2014 | Cronie | G11C 7/1006 365/149 |
| 2014/0122832 A1* | 5/2014 | Ngai | G06F 9/30036 712/7 |
| 2014/0189667 A1* | 7/2014 | Kanhere | G06F 8/445 717/160 |
| 2014/0298472 A1* | 10/2014 | Kouskoulas | G06F 21/577 726/25 |
| 2015/0120306 A1* | 4/2015 | Lee | G10L 19/0204 704/500 |
| 2015/0149747 A1* | 5/2015 | Lee | G06F 9/30065 712/241 |
| 2015/0212836 A1* | 7/2015 | Rong | G06F 9/4552 718/1 |
| 2016/0006457 A1* | 1/2016 | Best | G06F 11/1004 714/755 |
| 2016/0110171 A1* | 4/2016 | Bikshandi | G06F 7/4806 717/160 |
| 2016/0259628 A1* | 9/2016 | Schuchman | G06F 8/4441 |
| 2017/0123770 A1* | 5/2017 | Schuele | G06F 8/433 |

OTHER PUBLICATIONS

Intel, a Guide to Vectorization with Interl C++ Compilers, 2012, [Retrieved on Jul. 25, 2018]. Retrieved from the internet: <URL: https://software.intel.com/sites/default/files/nn/4/8/8/2/a/31848-CompilerAutovectorizationGuide.pdf> 39 Pages (1-39) (Year: 2012).*

Samuel Larsen et al., Exploiting Vector Parallelism in Software Pipelined Loops, 2005, [Retrieved on Jul. 25, 2018]. Retrieved from the internet: <URL: http://groups.csail.nnit.edu/commit/papers/05/Larsen-MICRO38.pdf> 8 Pages (1-11) (Year: 2005).*

Leaf Petersen et al., Automatic SIMD Vectorization for Haskell, 2013, [Retrieved on Jul. 25, 2018]. Retrieved from the internet: <URL: http://www.leafpetersen.com/leaf/publications/icfp2013/vectorization-haskell.pdf> 12 Pages (1-12) (Year: 2013).*

* cited by examiner

SYSTEM AND METHOD FOR MODULO ADDRESSING VECTORIZATION WITH INVARIANT CODE MOTION

CROSS REFERENCE TO RELATED APPLICATION(S)

The present application claims priority to Romanian Application No. RO A201501009, entitled "System and Method for Modulo Addressing Vectorization with Invariant Code Motion," filed on Dec. 15, 2015, the entirety of which is herein incorporated by reference.

FIELD OF THE DISCLOSURE

This disclosure generally relates to data processing and in particular to a method for modulo addressing vectorization with invariant code motion.

BACKGROUND

A processor core can execute memory access instructions that read data from a memory address, write data to a memory address, or that do both. These memory access instructions can be part of a loop to be repeatedly executed in the hardware of the processor core. For example, the particular memory access sequence performed by memory access instruction can be calculated within the loop using a modulo operation. However, looping calculated addresses of access instructions using such modulo operations can be a time consuming operation for the processor core by virtue of requiring the loop instructions to be executed multiple times and by virtue of the hardware characteristics of the module operation.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

A compiler processing device accesses instructions to be executed by a particular target processor device to determine which instructions are memory access instructions. The compiler then determines whether a detected memory access instruction is a candidate instruction for optimization, e.g., replacement. For example, access instructions within loops having destination addresses that are calculated based upon a modulo arithmetic operation can be considered candidates for optimization when the target data processor is capable of executing certain vector based instructions, such as Single Input Multiple Data (SIMD) instructions, and capable of executing certain vector modulo addressing instructions.

Each candidate instruction is evaluated to determine whether it is a candidate to be replaced by code that implements a vectorized invariant access. If not, the candidate instruction can be further evaluated to determine whether it is, alternatively, a candidate to be replaced by code that implements a vectorized modulo addressing access. If either case is true, the loop based access instruction is replaced with corresponding vector based instructions, allowing the modulo calculation to be eliminated from the loop. Otherwise, the candidate instruction is maintained.

Figure 1:
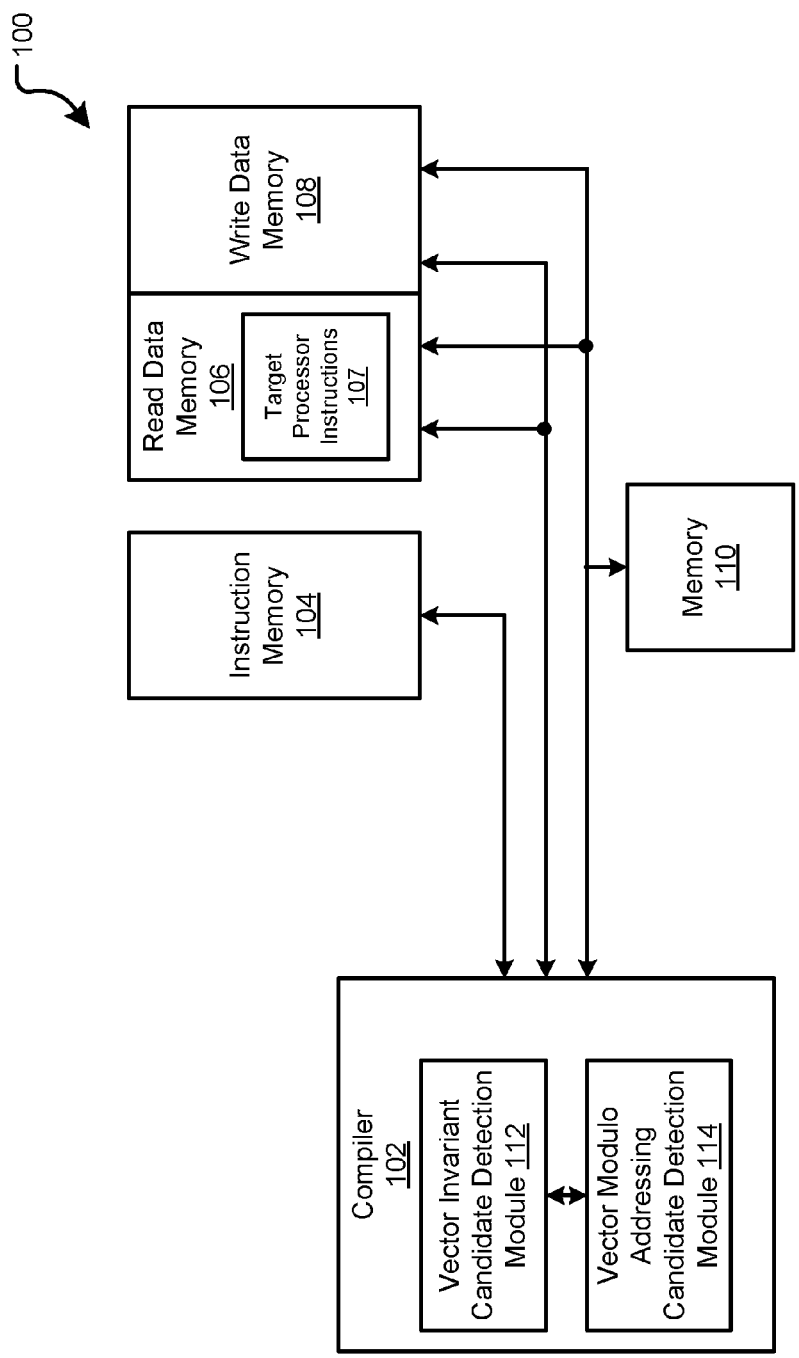
FIG. 1 illustrates a portion of a processor subsystem in accordance with at least one embodiment of the present disclosure.

FIG. 1 illustrates a portion of a processor subsystem 100 in accordance with at least one embodiment of the present disclosure. The processor subsystem 100 includes a compiler 102, an instruction memory 104, a read data memory 106, a write data memory 108, and other memory 110. The compiler 102 is typically implemented by a data processor executing code from an instruction memory, such as from instruction memory 104, and includes a vector invariant candidate detection module 112 and a vector modulo addressing detection module 114. In an embodiment, the vector invariant candidate detection module 112 and the vector modulo addressing candidate detection module 114 can represent hardware components of the processor that execute specific instruction code stored at memory 104, or the like.

During operation, the compiler 102 operates to determine whether instructions for a target processor (not shown) that are stored at memory portion 107 can be optimized. According to an embodiment, the compiler 102 can analyze the target processor instructions stored in the memory portion 107 and can detect those memory access instructions that are memory access instructions that are candidates for possible optimization. In an embodiment, the possible optimization of the memory access instructions can be replacing the memory access instruction with vector invariant access code or vector modulo addressing access code. An exemplary function "foo" that includes a memory access request that can be evaluated by the compiler 102 is provided below:

```
#define MAX 1600
void foo(short * restrict dst_attribute_((aligned(16))),
    short * restrict src_attribute_((aligned(16))))
{
  int i;
  for (i=0; i<MAX; i++)
  {
  dst[i]=src[i%8];
  }
}
```

The above exemplary C function, 'foo' declares that both the destination and source accesses are aligned with a 16 bit address space. The foo function also includes a loop portion that will cause a processor device to load a value from a source address, represented by [i%8], and store the value at a destination address, represented by [i], for each value of i as i is incremented by each loop cycle. It will be appreciated that absent intervention by the compiler 102, the target code, when executed, will perform a modulo operation during each iteration of the loop.

By determining that there is a load/store access within the loop of foo that has its source address calculated based upon a modulo operation, i%8, compiler 102 can identify the access src[i%8] as a possible candidate.

The compiler 102 next determines whether the memory access src[i%8] is a candidate for replacement by either vector invariant access code or by vector modulo addressing access code. For example, the compiler 102 can provide the memory access code to the vector invariant candidate detection module 112 to determine if the access instruction can be replaced by vector invariant access code. If not, the compiler 102 can provide the memory access code to the vector modulo addressing candidate detection module 114 to determine if the access instruction can be replaced by vector modulo addressing access code.

In a simplistic embodiment, the vector invariant candidate detection module 112 can assume that the base source address and an accessed width for the addresses in the memory access are both constant. In this embodiment, vector invariant candidate detection module 112 can determine if the memory access instruction can be replaced by vector invariant access code by analyzing the modulo operation used to compute the addresses accessed by the memory access instruction. In particular, the vector invariant candidate detection module 112 can determine whether the modulo calculation i%8 generates a periodic induction variable with a step of 1 between consecutive loop iterations that repeat. For example, the results of the modulo calculation i%8 of the loop results in the values 0, 1, 2, 3, 4, 5, 6, 7, 0, 1, 2, 3, 4, 5, 6, 7 for values of i 0-15, which discloses that the modulo calculation of the address has a step of 1 and is periodic.

In a more complex embodiment, the vector invariant candidate detection module 112 does not assume that the base source address and the accessed width for the memory access are both constant. In this embodiment, the vector invariant candidate detection module 112 can determine whether the memory access instruction is a periodic induction variable by utilizing the following equation src+accessed_width*(i%8) to determine the memory footprint of the accessed addresses. In C programming language, src can be considered as an array with the data type T. For example, an array of data type T src[10] is represented in memory as 10 consecutive elements of type T (having a size in bytes equal with the size of the width of type T). In an embodiment, a particular processor architecture can have an integer variable (int) that is 4 bytes, and a short integer variable (short) that is 2 bytes. Therefore, the compiler 102 can determine that the address of src[i%8]=src+accessed_width*(i%8) based upon the value of i and the width of each access.

In this example, the vector invariant candidate detection module 112 can conclude that the access address is a periodic induction variable by virtue of the source address 'src' being loop invariant, e.g., the start value of the array does not change between loop iterations, accessed_width being loop invariant, e.g., remains the same value in each loop iteration, and because only 'i' varies in each loop iteration by a fixed amount. In an embodiment, i is incremented by 1 in each loop, which means that i%8 varies between 0 and 7 in each loop iteration (e.g., the next loop iteration after an iteration i is either i+1, or 0 if i=7). Therefore, the access address varies between src+accessed_width and src+accessed_width*7. This means that when going from iteration i to iteration i+1, if in iteration i a target processor accessed src+accessed_width*j (j=i%8), in iteration i+1 the target processor would access the next element in the array src+accessed_width*(j+1) or reset to src+accessed_width if in iteration i j=7. This means that the accessed address is a step-1 periodic induction variable. Thus, the modulo result has a step of 1 that repeats, and, therefore is periodic by varying between 0 and 7 twice. This would result in 16 values being accessed from eight different locations twice, e.g., by access requests src[0], src[1], src[2], src[3], src[4], src[5], src[6], src[7].

After determining that the modulo operation is a periodic induction variable with a step of 1 between each iteration, the vector invariant candidate detection module 112 checks the vectorization factor [chosen by a vectorization algorithm] for the target processor of the memory access, which for the sake of this example is considered 16, e.g., the width of each individually accessed data space.

In an embodiment, a vectorization algorithm is an algorithm that takes a loop and determines if it is profitable (e.g., faster and less complex instructions) to unroll the loop a number of times, e.g., to duplicate the loop body one or multiple times, in order to vectorize the operations within the loop. There can be multiple different techniques to establish the best vectorization factor, primarily based on the architecture representation of the target processor and what kind/length of vector operations the target processor allows. In an embodiment, vector operations can include arithmetic, logic, load, store, compare, or the like operations made in parallel. For example, if the following exemplary loop is considered:

(i=0; i<MAX; i++)
[LOOP BODY]

Then for a vectorization factor of 8, the loop can be replaced with the following code:

(for (i=0; i<MAX; i+=8)
[LOOP BODY, LOOP BODY, LOOP BODY, LOOP BODY, LOOP BODY, LOOP BODY, LOOP BODY, LOOP BODY]

The exemplary replacement code can cause a target processor to perform the operations from iteration i . . . i+7 during a single pass and can enable the operations to be performed in parallel if allowed by the architecture of the target processor.

The vector invariant candidate detection module 112 can then determine whether the vectorization factor is divisible by the modulo factor of the memory access instruction. In this example, the vectorization factor of 16 is divisible by the modulo factor of 8. Thus, the vector modulo invariant detection modulo 112 can determine that the memory access is valid a candidate to be replaced by vector invariant access code in response to the modulo operation being a periodic induction variable with a step of 1 between each iteration, because the vectorization factor is divisible by the modulo, and checking alias information. In an embodiment, alias analysis to get the alias information is a compiler technique that determines if two memory accesses may/will access the same address. For example, if a STORE to that address is made, followed by a LOAD, the LOAD cannot be moved above the STORE, as it will change the behavior of the program.

In response to the memory access instruction being a vector modulo invariant access candidate, the compiler 102 can vectorize the memory access instruction and can extract the vectorized accesses out of the loop as being a loop invariant. As used herein, vectorizing a memory access instruction means vectorizing the addresses to be accessed during different iterations of the memory access instruction. In an embodiment, the vectorized access can be extracted. For example, the vectorized access can be moved outside of the loop so that the vectorized access is executed before the target processor executes instructions in the loop, as will be described more fully with respect to the exemplary replacement code below. If the candidate to be replaced by vector invariant access code detection module 112 determines that the memory access to src[i%8] in a function foo is vector modulo invariant, there is no need to determine whether the memory access instruction is a candidate for replacement by vector modulo addressing access code.

Because the modulo vector is a periodic induction variable with a step of 1 between each iteration, and because the vectorization factor is divisible by the modulo, the compiler 102 can replace the memory access of the foo as shown in the following sample code embodiment:

```
[doen.0 #+MAX/16;
ld.4l (r1), d0:d1:d2:d3]
[
    tfr.2x      d0, d1, d4:d5
    tfr.2x      d2, d3, d6:d7
]
LOOPSTART0
L2
    st.8l       d0::d7,(r0)+
LOOPEND0
```

The above code is exemplary code that will replace the memory access request for a particular processor architecture, such as a StarCore architecture, that supports vectorization. In the exemplary replacement code, the same eight data values are accessed a number of times by the loop of the memory access. As used herein, replacing the memory access instruction with replacement code means replacing not only the memory access instruction itself, but also the other code associated with the memory access instruction, e.g. the loop instruction itself may be replaced or removed. As discussed below, the compiler 102 removes a modulo operation that is related to the memory access instruction when the memory access instruction is vectorized and extracted as invariant. As described, the memory access instruction can be extracted as invariant so that a modulo instruction associated with the original memory access instruction will not be decoded and processed by the instruction pipeline.

The compiler 102 generates the replacement code provided above based on the memory access instruction candidate. For example, the instruction: 'doen.0 #+MAX/16' is a loop control instruction that sets a loop register r0 to a particular value indicating the number of times that the loop is executed. In an embodiment, the number of times the loop is executed is based on the MAX value of the foo routine and the vectorization factor associated with the memory access, and is specified by the operand #+MAX/16. In an embodiment, the compiler 102 calculates the operand value by dividing the MAX value in the foo by the vectorization factor, e.g., 1600/16=100.

The compiler 102 then vectorizes the memory instruction dst[i]=src[i%8] to create a vectorized access including instructions 'ld.4l (r1), d0:d1:d2:d3', 'tfr.2x d0, d1, d4:d5', and 'tfr.2x d2, d3,d6:d7'. In an embodiment, the compiler 102 creates the instruction 'ld.4l (r1), d0:d1:d2:d3' to cause an executing target processor to load four 32-bit long words (eight 16 bit values, 2 in each register) from memory into data registers d0-d3. For example, this instruction can cause a processor to load the values at source addresses src[0 . . . 7] into data registers d0 . . . d3.

The compiler 102 can create the instructions 'tfr.2x d0, d1, d4:d5' and 'tfr.2x d2, d3,d6:d7' to cause a processor to copy the values of (d0 . . . d3), which are the values from source address src[0 . . . 7], into d4 . . . d7. Thus, the execution of these two transfer instructions by an executing target processor to store the values of source addresses src[0 . . . 7, 0 . . . 7] into data registers d0 . . . d7. The instruction 'LOOPSTART0' is the start of a hardware loop.

The compiler 102 creates the code 'st.8l d0::d7,(r0)+' that can cause the target processor to store eight 32 bit values (sixteen 16 bit values, 2 packed in one register) from d0-d7 at the address register r0, and to perform a post-increment on register r0; and the code 'LOOPEND0' can end the hardware loop and can contain a backwards jump to loop start (L2). In an embodiment, the execution of this hardware loop can cause a target processor to store the value of source addresses, represented by src[0 . . . 7, 0 . . . 7], into destination addresses, represented by dst[i . . . i+7]. Thus, the compiler 102 can optimize the candidate memory access instruction of the foo by replacing the candidate memory access instruction with the vectorized and extracted access in the replacement code.

According to an embodiment, the compiler 102 can analyze additional target processor instructions that are stored in the memory portion 107 and can determine whether those memory access instructions can be optimized. Thus, the compiler 102 can detect another memory access instruction within the memory portion 107 that is a candidate for possible optimization.

An exemplary function "foo" that includes a memory access request that can be evaluated by the compiler 102 is provided below:

```
#define MAX 160
void foo(int * restrict dst_attribute_((aligned(16))),
int * restrict src_attribute_((aligned(16))))
{
    int i;
    for (i=0; i<MAX; i++)
    {
        dst[i] = src[i%16];
    }
}
```

The above exemplary C function, 'foo' declares that both the destination and source address to be aligned with a 16 bit address space. The function foo also includes a loop portion that will cause a processing device to load a value from a source address, represented by [i%16], and store the value at a destination address, represented by [i], for each value of i as i is incremented by each loop cycle. Thus, absent intervention by the compiler 102, the target code, when executed, will perform a modulo operation during each iteration of the loop.

By determining that there is a load/store access within the loop of the foo that has its source address calculated based upon a modulo operation, i%16, the compiler 102 can identify the access src[i%16] as a possible candidate for replacement by either vector invariant access code or by vector modulo addressing access code. The compiler 102 can provide the memory access code to the vector invariant candidate detection module 112 to determine if the access instruction can be replaced by vector invariant access code. If not, the compiler 102 can provide the memory access code to the vector modulo addressing candidate detection module 114 to determine if the access instruction can be replaced by vector modulo addressing access code.

The vector invariant candidate detection module 112 can first analyze the modulo operation used to compute the addresses accessed by the memory access instruction. In particular, the vector invariant candidate detection module 112 can determine whether the modulo calculation i%16 generates a periodic induction variable with a step of 1 between consecutive loop iterations that repeat. For example, the vector invariant candidate detection module 112 can determine that the modulo is a periodic induction variable with a step of 1 between each iteration because the modulo calculation i%16 of the loop results in the values 0, 1, 2, 3, 4, 5, 6, 7, 8, 9, 10, 11, 12, 13, 14, 15, 0, 1, 2, 3, 4, 5, 6, 7, 8, 9, 10, 11, 12, 13, 14, and 15 for values of i 0-31.

The vector invariant candidate detection module 112 can then check the vectorization factor [chosen by the vectorization algorithm described above] for the target processor of the memory access, which for the sake of this example is considered 8, e.g., the width of each individually accessed data. The vector invariant candidate detection module 112 can then determine whether the vectorization factor is divisible by the modulo factor of the memory access instruction. In this example, the vectorization factor of 8 is less than the modulo factor 16, such that the vectorization factor of is not divisible by the modulo factor. The vector invariant candidate detection module 112 can therefore determine that the memory access is not a candidate for replacement by a vector invariant access. The compiler 102 can then send the memory access code to the vector modulo addressing candidate detection module 114 to determine if the access instruction can be replaced by vector modulo addressing access code.

The vector modulo addressing candidate detection module 114 can first check the architecture constraints related to vector modulo addressing for the target processor. For example, in a particular architecture, such as StarCore architecture, the vector modulo addressing candidate detection module 114 can determine whether the modulo factor used in the computation of the address accesses by the memory access instruction is aligned at a proposed vector access. In an embodiment, the vector access can be calculated based on a size of a scalar access in the memory access instruction, and a grouping factor for a number of accesses. The scalar access and the grouping can be based on the architecture of the target processor. The vector modulo addressing candidate detection module 114 can determine that the scalar access is a size of an integer type for the architecture of the target process, and in an exemplary architecture the size can be set to 4. The vector modulo addressing candidate detection module 114 can also determine, based on the architecture of the target processor, that the accesses can be grouped together in groups of 4 accesses. The proposed vector access size can then be calculated based on multiplying the scalar access size with the size of the access group, e.g., 4*4=16.

The vector modulo addressing candidate detection module 114 can then make the determination whether a modulo value at loop entry for the address accessed by i%16 is aligned at the vector access by calculating a value for the modulo factor (16) mod the proposed vector access (4*4), e.g., 16%(4*4)=0. Therefore, the vector modulo addressing candidate detection module 114 can determine that the modulo factor for the memory access instruction is aligned at the vector access in response to the modulo factor mod the vector access being equal to zero.

The vector modulo addressing candidate detection module 114 can then continue checking other architecture constraints related to the target processor to execute the vector modulo addressing. For example, the vector modulo addressing module 112 can determine whether the memory accessed by a vector modulo access would exceed a modulo buffer end or bound. In an embodiment, vector modulo addressing can be a hardware feature that allows addition computations to be made using modulo arithmetic that is inherent to the addressing mode.

In an embodiment, the vector modulo addressing candidate detection module 114 can determine whether the memory accessed by a vector modulo access would exceed a modulo buffer end based on initial modulo addressing instructions. For example, the initial modulo addressing instructions can identify a register, such as R, a start address (B) for the access, and a value (M) for the modulo. These values (R, B, and M) declare that when hardware executes code between a set modulo instruction and a reset modulo instruction of the access instruction, any access of R is to an address between B and B+M. Thus, the vector modulo addressing candidate detection module 114 can determine that at a certain moment during the execution of the code by the target processor the following equation for a register access would be true: R=B+c1, with c1<M and c1 being any value set by a current iteration of the access. However, when the target processor would encounter R=R+c2, during another iteration of the access and c2 is another value set during this iteration, the target processor would actually execute R=B+(c1+c2)% M.

In an embodiment, the vector modulo addressing candidate detection module 114 can determine that when a vector modulo addressing instruction of length N is issued, a target processor would load N elements of size L from the address in R. Thus, the vector modulo addressing instruction accesses the addresses R:R+N*L. Therefore, the vector modulo addressing candidate detection module 114 can check that R+N*L<B+M, meaning that the last accessed address, represented by R+N*L, would not exceed the modulo buffer end, represented by B+M. In the example code provided above, after vectorization by 4, each loop iteration can access 4 elements, represented by the access src[i%4].

Additionally, vector modulo addressing candidate detection module 114 can detect that i is 0 at loop entry because i starts with 0. Therefore, each loop iteration can access src[0:3], src[4:7], src[8:11], src[12:15] for i=0 . . . 15. In an embodiment, 2 loop iterations can be performed considering the vectorization factor of 8. The vector modulo addressing candidate detection module 114 can then determine and mark the memory access instruction as a candidate for replacement by vector modulo addressing access code in response to architecture constraints for the target processor being met. In particular, the vector modulo addressing candidate detection module 114 can mark the memory access instruction as a candidate for replacement by vector modulo addressing access code in response to determining that the memory access instruction is aligned at the vector access, and that the vector memory accesses do not go over the buffer bound.

In response to the memory access instruction being a candidate for replacement by vector modulo addressing access code, the compiler 102 can vectorize the memory access instruction using a vectorization factor of 8 and two load instructions of 4 consecutive 32 bit values based on the source address alignment. The compiler 102 can then add a modulo addressing set code (bmseta) before the loop code and a modulo addressing reset code (bmclra) after the loop code in the memory access instruction as described below. The compiler 102 can also remove the modulo operation related to the memory access instruction based on the memory access being a candidate for vector modulo addressing. The compiler 102 can then replace memory access instruction in the function foo using the code below:

[ bmseta #+MAX/20,mct1.1; ora r0,r0,r8]
LOOPSTART0
L2
   1d.41 (r0)+.d0:d1:d2:d3
   1d.41 (r0)+,d4:d5:d6:d7
   st.81 d0::d7,(r1)+
LOOPEND0
L3
[ bmclra #+15,mct1.1; rts]

The compiler 102 generates the replacement code provided above based on the memory access instruction candidate. For example, the instruction 'bmseta #+8,mct1.1' can cause an executing target processor to bit mask set a low portion of a modulo control register. The instruction 'ora r0,r0,r8' can cause an executing target processor to perform a bitwise OR operation between register r0 and itself and store the result in register r8. In an embodiment, this instruction can be a preferred instruction to store the values of one register into another register. However, different instructions can be used without varied from the scope of the disclosure. Thus, these two instructions can cause an executing target processor to configure settings for modulo addressing of the memory access. In particular, these instructions can set register r0 as a modulo register.

A hardware loop start is identified by the 'LOOPSTART0' in the example replacement code above. In an embodiment, the compiler 102 implements vector modulo addressing of the memory access instruction dst[i]=src[i%16] to create the instructions '1d.41 (r0)+,d0:d1:d2:d3', '1d.41 (r0)+,d4:d5:d6:d7', and 'st.81 d0::d7,(r1)+'. In an embodiment, the compiler 102 creates the instruction '1d.41 (r0)+,d0:d2:d3' to cause an executing target processor to load four consecutive 32 bit values from memory and store them in data registers d0,d1,d2,d3 and then increment r0 using modulo arithmetic. The compiler 102 creates the instruction '1d.41 (r0)+,d4:d5:d6:d7' to cause an executing target processor to load the next four consecutive 32 bit values from the memory and store them in data registers d4,d5,d6,d7 and then increment r0 using modulo arithmetic. The compiler 102 can create the instruction 'st.81 0::d7,(r1)+' to cause an executing processor to store, at the address of register r1, the eight 32 bit values of the data registers d0-d7 and then to increment r1 with simple arithmetic. In an embodiment, r1 is incremented using simple arithmetic instead of modulo arithmetic based on r1 not being set as a modulo register by the bmseta instruction of the replacement code. The instruction 'LOOPEND0' ends the hardware loop. Finally, the code 'bmclra #+15,mct1.1; rts' resets the settings for modulo addressing, e.g., clears r0 from being set as a modulo register.

According to an embodiment, the compiler 102 can again analyze target processor instructions stored in the memory portion 107 and can determine whether those memory access instructions can be optimized. Thus, the compiler 102 can detect another memory access instruction within the memory portion 107 that is a candidate for possible optimization.

An exemplary function foo that includes a memory access instruction that can be evaluated by the compiler 102 is provided below:

```
#define MAX 160
void foo(int * restrict dst__attribute__((aligned(64))),
int * restrict src__attribute__((aligned(64))))
{
    int i;
    for (i=0; i<MAX; i++)
    {
        dst[i] = src[i%16];
    }
}
```

The above exemplary function, the 'foo', declares that both the destination and source addresses are aligned with a 64 bit address space. The function foo also includes a loop portion that can cause a processor to load a value from a source address, represented by [i%16], and store the value at a destination address, represented by [i], for each value of i as i is incremented by each loop cycle.

By determining that there is a load/store access within the loop of foo that has its source address calculated based upon a modulo operation, i%16, the compiler 102 can identify the access src[i%16] as a possible candidate for replacement by either a vector invariant access or by a vector modulo addressing access. The compiler 102 can provide the memory access code to the vector invariant candidate detection module 112 to determine if the access instruction can be replaced by vector invariant access code. If not, the compiler can provide the memory access code to the vector modulo addressing candidate detection module 114 to determine if the access instruction can be replaced by vector modulo addressing access code.

The vector invariant candidate detection module 112 can first analyze the modulo operation used to compute the addresses accessed by the memory access instruction. In particular, the vector invariant candidate detection module 112 can determine whether the modulo calculation i%16 is a periodic induction variable with a step of 1 between consecutive loop iterations that repeat. For example, the vector invariant candidate detection module 112 can determine that the modulo a periodic induction variable with a step of 1 between each iteration because i starting with 0, and being incremented by 1. Thus, the results of the modulo calculation i%16 of the loop results in the values 0, 1, 2, 3, 4, 5, 6, 7, 8, 9, 10, 11, 12, 13, 14, 15, 0, 1, 2, 3, 4, 5, 6, 7, 8, 9, 10, 11, 12, 13, 14, and 15 for values of i 0-31.

The vector invariant candidate detection module 112 can also check the vectorization factor as described above for the target processor of the memory access, which for the sake of this example is 8. The vector invariant candidate detection module 112 can then determine whether the vectorization factor is divisible by the modulo of the memory access instruction. In this example, the vectorization factor of 8 is not greater than the modulo factor 16, such that the vectorization factor of is not divisible by the modulo factor. The vector invariant candidate detection module 112 can therefore determine that the memory access is not a candidate for replacement by vector invariant access code. The compiler 102 can then send the memory access code to the vector modulo addressing candidate detection module 114 to determine if the access instruction can be replaced by vector modulo addressing access code.

The vector modulo addressing candidate detection module 114 can check the architecture constraints related to vector modulo addressing for the target processor. In particular, the vector modulo addressing candidate detection module 114 can determine whether the modulo factor of the memory access instruction is aligned at the vector access, and whether the vector memory accesses go over a modulo buffer bound.

In an embodiment, the vector modulo addressing candidate detection module 114 can determine whether the modulo factor of the memory access instruction is aligned at the vector access by first determining that a start value at loop entry for the memory address accessed by the memory access instruction is aligned at 64 as declared in the function foo. In an embodiment, the scalar access for the architecture of the target process can be 4 as described above. The vector modulo addressing candidate detection module 114 can then determine a maximum vector length of 16 based on the scalar access of 4 (as described above).

The vector modulo addressing candidate detection module 114 can then make the determination whether a modulo value at loop entry for the address accessed by i%16 is aligned at the vector access by calculating a value for the modulo factor (16) mod the proposed vector access (16), e.g., 16% 16=0. Therefore, the vector modulo addressing candidate detection module 114 can determine that the modulo factor for the memory access instruction is aligned at the vector access in response to the modulo factor mod the vector access being equal to zero.

The vector modulo addressing candidate detection module 114 can then determine whether the memory accessed by a vector modulo access would exceed a buffer end or bound. In an embodiment, the vector modulo addressing candidate detection module 114 can utilize initial modulo addressing instructions that identify a register (R), a start or based address (B), and a value for a modulo factor (M) to determine whether a vector modulo access would exceed a buffer end or bound. As described above, if the vector modulo addressing candidate detection module 114 determines that R+N*L<B+M then the vector modulo addressing candidate detection module 114 can determine that the last accessed address in the memory would not exceed the buffer end.

In the example code provided above, after vectorization by 8, each loop iteration can access 8 elements for src [i%16]. Additionally, vector modulo addressing candidate detection module 114 can detect that i is 0 at the loop entry because the foo declares that i starts with 0. Therefore, each loop iteration can access src[0:7], src[8:15], src[0:7], src[8:15] for i=0 . . . 31. The vector modulo addressing candidate detection module 114 can then determine and mark the memory access instruction as a candidate for replacement by vector modulo addressing access code in response to architecture constraints for the target processor being met. In particular, the vector modulo addressing candidate detection module 114 can mark the memory access instruction as a candidate for replacement by vector modulo addressing access code in response to determining that the memory access instruction is aligned at the vector access, and that the vector memory accesses do not go over the buffer bound.

In response to the memory access instruction being a candidate for replacement by vector modulo addressing access code, the compiler 102 can vectorize the memory access instruction using two load instructions of 8 consecutive 32 bit values based on the source address alignment. The compiler 102 can then add a modulo addressing set code (bmseta) before the loop code and a modulo addressing reset code (bmclra) after the loop code in the memory access instruction. The compiler 102 can also remove the modulo operation related to the memory access instruction based on the memory access being a candidate for vector modulo addressing. The compiler 102 can then replace memory access instruction in the function foo using the code below.

```
[  bmseta  #+8,mctl.l; ora   r0,r0,r8;  ]
ld.8l     (r0)+,d0::d7
LOOPSTART0
L2
[
    st.8l     d0::d7,(r1)+
    ld.8l     (r0)+,d0::d7
]
LOOPEND0
[
    st.8l     d0::d7,(r1);
    bmclra    #+15,mctl.l;
    rts;
]
```

The compiler 102 generates the replacement code provided above based on the memory access instruction candidate. For example, the instruction 'bmseta #+8,mctl.1' can cause an executing target processing to bit mask set a low portion of a modulo control register. The instruction 'ora r0,r0,r8' can cause an executing target processor to perform a bitwise OR operation between register r0 and itself and store the result in register r8. Thus, these two instructions can cause an executing target processor to configure settings for modulo addressing of the memory access. In particular, these instructions can set register r0 as a modulo register.

A hardware loop start is identified by the 'LOOPSTART0' in the example replacement code above. In an embodiment, the compiler 102 implements vector modulo addressing of the memory access instruction dst[i]=src[i%16] to create the instructions 'st.81 d0::d7(r1)+' and 'ld.81 (r0)+,d0::d7'. In an embodiment, the compiler 102 creates the instruction 'st.81 d0::d7(r1)+' to cause an executing target processor to store eight consecutive 32 bit values from a memory, represented by r1, and into data registers d0,d1,d2,d3,d4,d5,d6, d7 and then increment r1 with simple arithmetic. In an embodiment, r1 is incremented using simple arithmetic instead of modulo arithmetic based on r1 not being set as a modulo register by the bmseta instruction of the replacement code. The compiler 102 creates the instruction 'ld.81 (r0)+, d0::d7' to cause an executing target processor to load the eight 32 bit values from the data registers d0,d1,d2,d3,d4, d5,d6,d7 and store the values into a memory, represented by r0, and then increment r0 using modulo arithmetic.

The compiler 102 can create the instruction 'st.81 0::d7, (r1)' to cause an executing processor to store, at the address of register r1, the eight 32 bit values of the data registers d0-d7. The instruction 'LOOPEND0' ends the hardware loop. Finally, the code 'bmclra #+15,mctl.1; rts' resets the settings for modulo addressing, e.g., clears r0 from being set as a modulo register.

Figure 2:
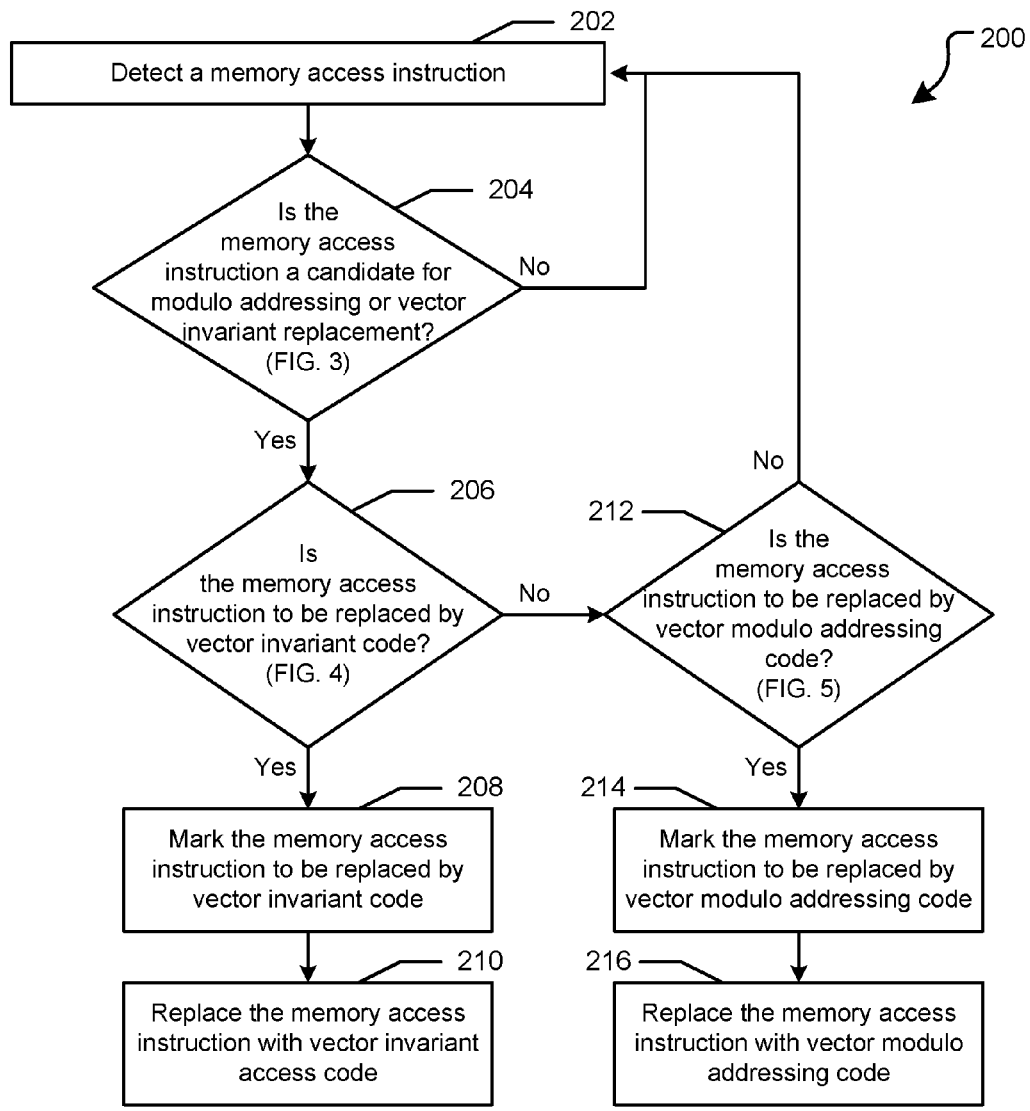
FIG. 2 illustrates a method for marking a memory access instruction as a candidate for replacement by either vector invariant access code or vector modulo addressing access code in accordance with at least one embodiment of the present disclosure.

FIG. 2 illustrates a method for marking a memory access instruction as a candidate for replacement by either vector invariant access code or vector modulo addressing access code in accordance with at least one embodiment of the present disclosure. At block 202, a processing device can detect a memory access instruction. In an embodiment, the processing device can be the compiler 102 of FIG. 1, which can detect the memory access instruction in the memory portion 107 of FIG. 1.

At block 204, a determination is made whether the memory access instruction is a candidate for replacement by vector invariant access code or by vector modulo addressing access code. In an embodiment, these determinations can be made by the vector invariant candidate detection module 112 and the vector modulo addressing candidate detection module 114 of FIG. 1. This determination is described in greater detail below with respect to FIG. 3. If the memory access instruction is not a candidate for either type of vector access the flow continues at block 202, as previously described, wherein another memory access instruction is detected. If the memory access instruction is identified as a candidate, the flow continues at block 206. At block 206, a determination is made whether the memory access instruction is to be replaced by vector invariant code, as described in greater detail at FIG. 4. If so, the flow proceeds to block 208 where the candidate is marked to be replaced by vector invariant code, and the flow proceeds to block 210. Otherwise, flow proceeds to block 212. At block 210, the memory access instruction is replaced by vector invariant access code. In an embodiment, the memory access instruction can be replaced with vector access code by the compiler 102 of FIG. 1.

Figure 5:
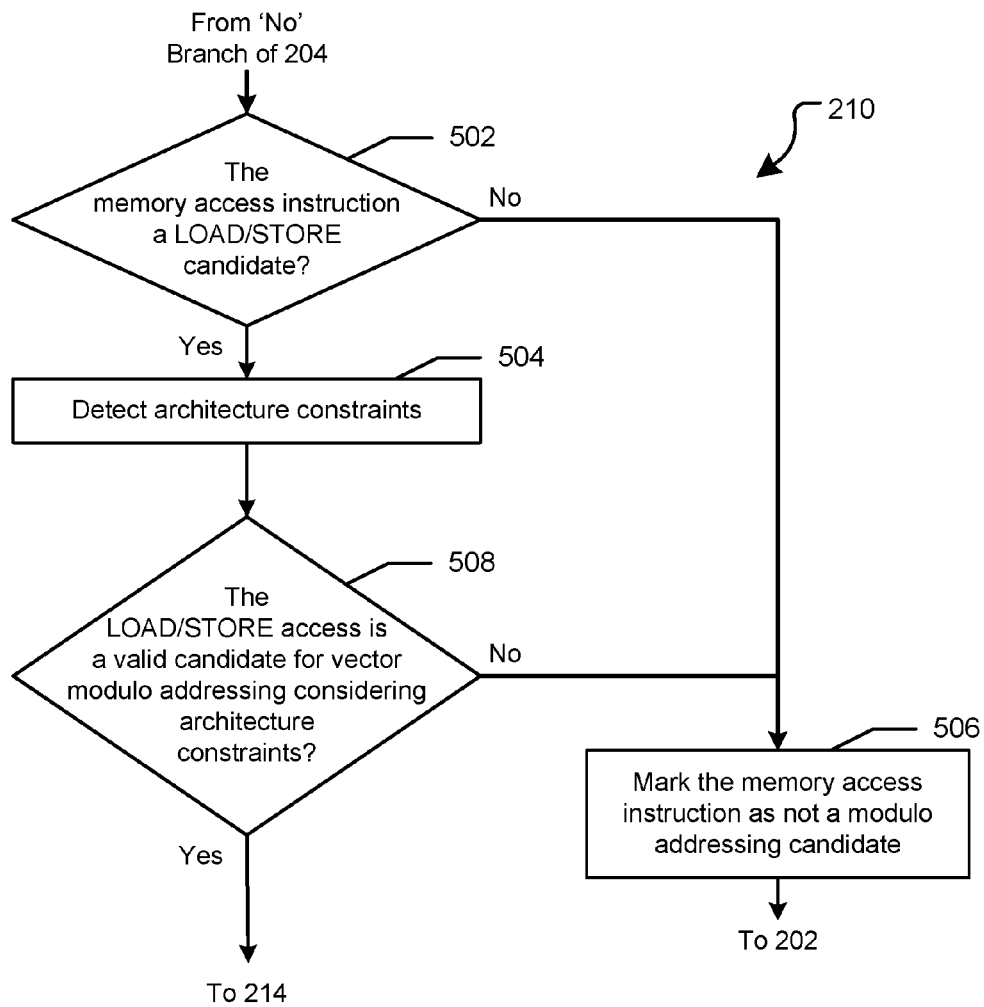
FIG. 5 is a particular embodiment of a portion of the method of FIG. 2 that illustrates a particular method for determining whether the memory access instruction is a candidate to be replaced by vector modulo addressing access code in accordance with at least one embodiment of the present disclosure.

At block 212, it is determined if the memory access instruction is to be replaced by vector modulo addressing access code, as described in greater detail at FIG. 5, if so, the flow proceeds to block 214 where the candidate is marked to be replaced by vector modulo addressing access code. Otherwise, the flow continues at block 202, as previously described, wherein another memory access instruction is detected. At block 214, the memory access instruction is replaced by vector modulo addressing access code. In an embodiment, the compiler 102 of FIG. 1 replaces the memory access instruction with the vector modulo addressing code.

Figure 3:
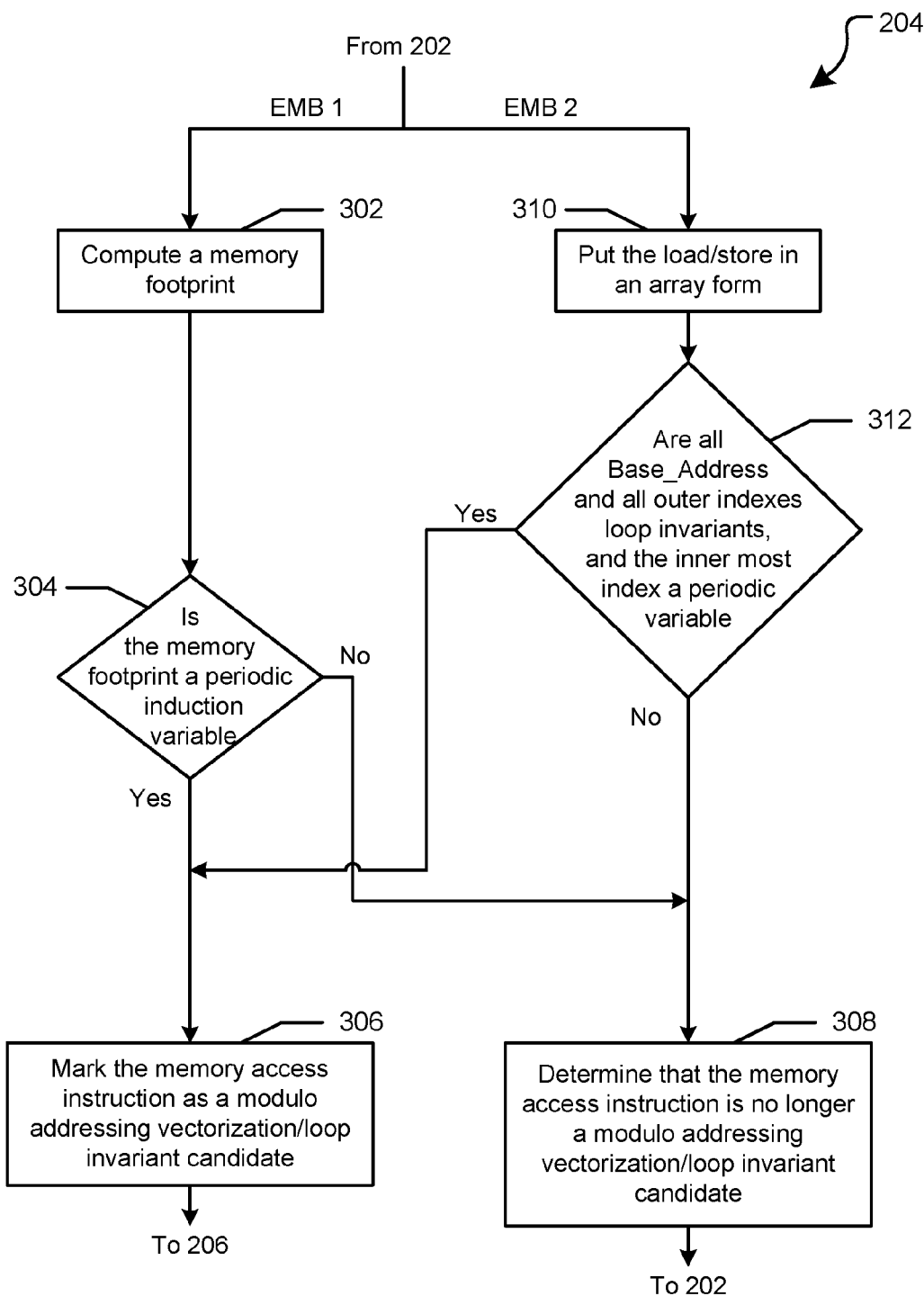
FIG. 3 is a particular embodiment of a portion of the method of FIG. 2 that illustrates a particular method for determining whether the memory access instruction is either a candidate for replacement by vector access code or vector modulo addressing access code in accordance with at least one embodiment of the present disclosure.

FIG. 3 illustrates a method corresponding to block 204 of FIG. 2 for determining whether the access instruction is a candidate for replacement by vector invariant access code or by a vector modulo addressing access code. FIG. 3 includes two different embodiments for determining whether the access instruction is a candidate for replacement by vector invariant access code or by a vector modulo addressing access code. The first embodiment utilizes a memory footprint of the accessed addresses, and the second embodiment utilizes generating an array of the values of the accessed addressed.

At block 302, the memory footprint of all addresses to be accessed by the memory access instruction is computed. At block 304, an analysis of the footprint determines whether the footprint is a periodic induction variable, so that each iteration is represented by the same values that increase by a fixed amount, as described above. If so, flow proceeds to block 306, otherwise the flow proceeds to block 308. At block 306, the memory access instruction is marked as a candidate for further optimization and the flow continues at block 206 of FIG. 2. In an embodiment, the vector invariant candidate detection module 112 or the vector modulo addressing candidate detection module 114 of FIG. 1 can mark the memory access instruction as a candidate. If at block 304, the memory footprint is not periodic, the flow proceeds to block 312 where it is determined that the access instruction is no longer a candidate, which corresponds to the return path to block 202 of FIG. 2.

At block 310, the memory access instruction is put in an array form. At block 312, the loop containing the access instruction is evaluated in the array form to determine whether each of the base address of the loop and the outer loop variables of the loop are invariants, and whether the inner most loop index is a periodic induction variable. If so, flow proceeds to as described above at block 306. Otherwise, it is determined that the access instruction is no longer a candidate and flow proceeds to block 308, which corresponds to the return path to block 202 of FIG. 2.

Figure 4:
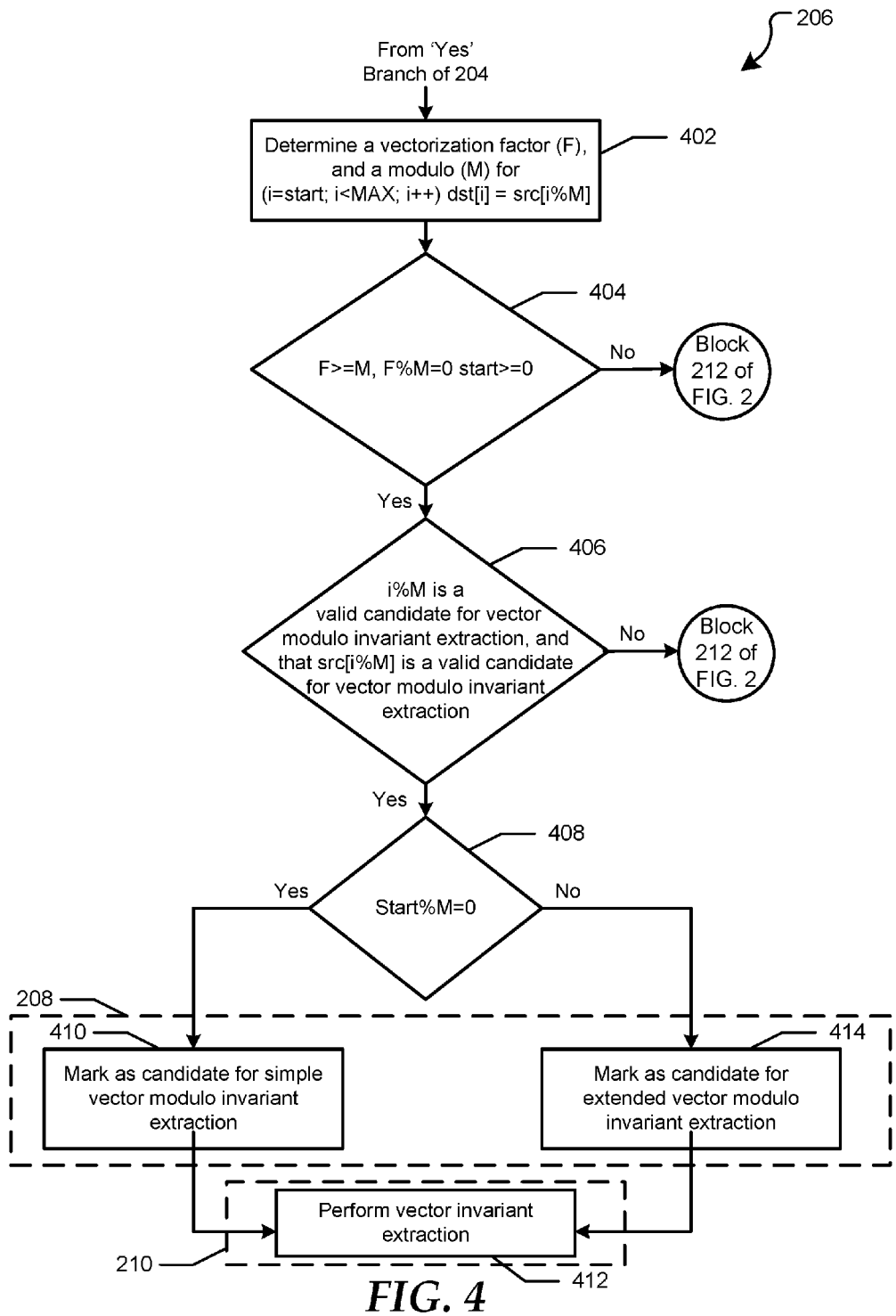
FIG. 4 is a particular embodiment of a portion of the method of FIG. 2 that illustrates a particular method for determining whether the memory access instruction is a candidate to be replaced by vector invariant access code in accordance with at least one embodiment of the present disclosure.

FIG. 4 illustrates a method corresponding to block 206 of FIG. 2 for determining whether the memory access instruction is a candidate to be replaced by vector invariant access code in accordance with at least one embodiment of the present disclosure. At block 402, a modulo value of the memory access instruction is determined, as is the vectorization factor of a target processor. At block 404, a loop containing the access instruction is evaluated to determine whether the vector length of the access instruction is greater than or equal to the modulo value, whether the vector length mod the modulo value is equal to zero, and whether the start value in the loop is positive. If each of these is true, the flow proceeds to block 406 for further analysis of the access instruction. Otherwise, it is determined that the access instruction is not a candidate for replacement by a simple or extended vector invariant access, and the flow continues at block 212 of FIG. 2 to determined whether the access instruction is a candidate for a vector modulo addressing access. At block 406, a determination is made whether the modulo function in the loop containing the memory access instruction is a vector invariant candidate, and whether the source address of the memory access is a valid candidate for vector modulo invariant extraction for example a source address is a candidate for vector modulo invariant extraction when the source address remains the same during each iteration of a loop in the memory access instruction, and is not a candidate for vector modulo invariant extraction when the source address changes between iterations of a loop in the memory access instruction. If so the flow continues at block 408. Otherwise, the flow continues at block 212 of FIG. 2 as stated above.

At block 408, a determination is made whether the modulo calculation within the loop containing the memory access instruction begins at zero. If the modulo of the memory access instruction begins at zero, the memory access instruction is marked as a candidate for simple vector modulo invariant extraction at block 410, and vector invariant extraction is performed at block 412. In an embodiment, the compiler, such as compiler 102 of FIG. 1, performs simple vector invariant extraction by extracting the access, e.g., src[0 . . . 8], from a loop associated with the memory access instruction and the access is used without being changed by the complier. In an embodiment, alias issues appear when the value calculated by the modulo of the accessed address is not invariant in the loop, e.g., the same memory location cannot be accessed. In an embodiment, a simple vector modulo invariant extraction of a memory access, e.g., (i=0; i<MAX; i++) {dst[i]=src[i%M]} with a vectorization factor of F, having no alias issues can result in the memory access being replaced with the exemplary code below:

tmp 1[0 . . . M−1]=src[0 . . . M−1];
tmp 2[0 . . . F−1]=PACK(tmp1[0 . . . M−1], . . . , tmp1[0 . . . M−1]);
for (i=start; i<MAX/F; i+=F) dst[i:i+F−1]=tmp2[0 . . . F−1];

In the exemplary code above, src[0 . . . M−1] contains the values for src[0, 1, 2 . . . M−1]; dst[i:i+F−1] contains the values for dst[i, i+1, . . . , i+F]. In an embodiment, the compiler, such as compiler 102 of FIG. 1, can create the simple vector modulo invariant code in response to F=2*M, e.g., the vectorization factor is twice the modulo value. Thus, the execution of the simple vector modulo invariant code by a target processor can cause the processor to vectorize the access by F. In an embodiment, the F values of a destination address, dst, are stored with F values of a source address, src[0 . . . M−1, 0 . . . M−1] outside of the loop in a tmp2 vector of F values. In an embodiment, tmp1 is a vector of F/2=M values. In an embodiment, a simple vector modulo invariant extraction can result in the loop containing the memory access, e.g., (i=0; i<MAX; i++) {dst[i]=src[i%M]} with a vectorization factor of F, with alias issues to be rewritten with the exemplary code below:

for (i=start; i<MAX/F; i+=F)
        dst[i]=src[0]; dst[i+1]=src[1]; . . . ; dst[i+M−1]=src[M−1];
        dst[i+M]=src[0];

If the modulo of the memory access instruction does not begin at zero, the memory access instruction is marked as a candidate for extended vector modulo invariant extraction at block 414, and vector invariant extraction is performed at block 412. In an embodiment, block 412 is a portion of the operations performed in block 210 of FIG. 2. In an embodiment, the compiler 102 of FIG. 1 can perform extended vector invariant extraction when memory access cannot be extracted from the loop as is, but additional manipulations by the compiler are needed. In an embodiment, the following exemplary memory access can be considered (i=0; i<MAX; i++) {dst[i]=src[i%M]} with a vectorization factor of F. In this embodiment, the memory instruction does not start with zero, the modulo value also does not start with zero, and the vectorization factor can be twice the modulo value. The extended vector modulo invariant extraction can replaced the memory access with no alias issues with the exemplary code below:

tmp1[0 . . . M−1−start%M]=src[start%M . . . start%M+M−1];
    tmp1[M−start%M . . . M−1]=src[0 . . . start%M−1];
    tmp2[0 . . . F−1]=PACK(tmp1[0 . . . M−1], . . . , tmp1[0 . . . M−1]);
    for (i=start; i<MAX/F; i+=F) dst[i:i+F−1]=tmp2[0 . . . F−1];

During execution of the replacement extended vector modulo invariant extraction code, by a target processor, the value of source address, src, in a first loop iteration is src[start%M]. However, after vectorization of the memory access instruction by F, the vectorization can result in a target processor accessing F=2*M values from source address, src, e.g., src[0 . . . M−1] twice. However, the accessing of the source address may not be in the 0 . . . M−1, 0 . . . M−1 order, but may start with start%M, as shown in the code for tmp1 and tmp2.

FIG. 5 illustrates a method corresponding a specific architecture implementation of block 212 of FIG. 2 for determining whether the memory access instruction is a vector modulo addressing candidate in accordance with at least one embodiment of the present disclosure. At block 502, a determination is made whether the memory access instruction is a LOAD/STORE candidate. If the memory access instruction is a LOAD/STORE candidate, architecture constraints are detected at block 504. Otherwise, it is determined that the access instruction is no longer a candidate and flow proceeds to block 506, which corresponds to the return path to block 202 of FIG. 2. In an embodiment, the architecture constraints can be StarCore SC3900 architecture constraints, or any other type of compiler constraints.

For example, architecture constraints can be whether the LOAD/STORE access is a valid candidate for vector modulo addressing considering the architecture constraints, e.g., the vector processing features supported, whether the modulo is divisible by an access width, and whether an accessed memory exceeds a buffer end. In an embodiment, an access width is the size of the memory being read/written by a load/store memory access. If, at block 508, it is determined that the accessed memory does not exceed a buffer size, and the modulo of the memory access instruction is divisible with an access width, the vectorization length is established considering the access width, flow proceeds to block 214 of FIG. 2 where the memory access instruction is marked as a candidate for replacement by vector modulo addressing access code. Otherwise, it is determined that the access instruction is no longer a candidate and flow proceeds to block 506, which corresponds to the return path to block 202 of FIG. 2.

Figure 6:
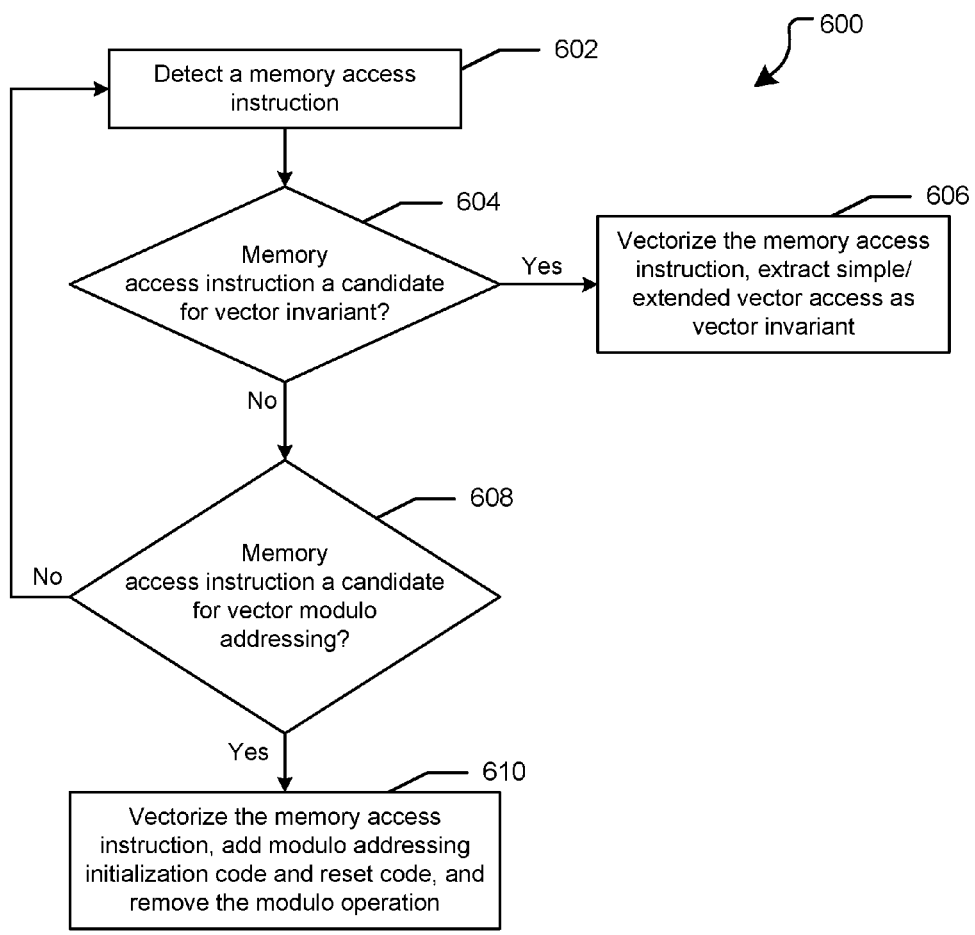
FIG. 6 illustrates a method for vectorizing the memory access instruction in accordance with at least one embodiment of the present disclosure.

FIG. 6 illustrates a method 600 for vectorizing the memory access instruction in accordance with at least one embodiment of the present disclosure. At block 602, a memory access instruction is detected. At block 604, a determination is made whether the memory access instruction is a candidate for vector modulo invariant access code replacement. In an embodiment, this determination is made by the vector invariant candidate detection module 112 of FIG. 1. If the memory access instruction is a candidate for vector modulo invariant, the memory access instruction is vectorized and a simple/extended vector access is extract as a vector modulo invariant at block 606.

According to one aspect, a method is disclosed in accordance with at least one embodiment of the present disclosure. The method includes detecting, by a compiler, a memory access instruction. The method further includes determining, by a vector invariant candidate detection module of the compiler, whether the memory access instruction is to be replaced by vector invariant access code. The method also includes that if the memory access instruction is to be replaced by vector invariant access code: generating first replacement code that vectorizes the memory access instruction using vector invariant access code, and replacing, by the compiler, the memory access instruction with the first replacement code. The method further includes that if the memory access instruction is not to be replaced by vector invariant access code, determining, by a vector modulo addressing candidate detection module of the compiler, whether the memory access instruction is to be replaced by vector modulo addressing access code. The method also includes that in response to determining that the memory access instruction is to be replaced by vector modulo addressing access code: generating second replacement code that vectorizes the memory access instruction using vector modulo addressing code, and replacing, by the compiler, the memory access instruction with the second replacement code.

In an embodiment, generating the second replacement code that vectorizes the memory access instruction using vector modulo addressing code includes: adding a modulo addressing set code before vectorized code in the second replacement code, and adding a modulo addressing reset code after the vectorized code in the second replacement code. In an embodiment, the first replacement code includes simple vector access invariant code, and does not include a modulo operation from a loop instruction associated with the memory access instruction. In an embodiment, the first replacement code includes extended vector access invariant code, and does not include a modulo operation from a loop instruction associated with the memory access instruction.

In an embodiment, determining whether the memory access instruction is to be replaced by vector invariant access code includes determining a modulo value of the memory access instruction. Determining whether the memory access instruction is to be replaced by vector invariant access code also includes determining whether a vector length is greater than or equal to the modulo value. Determining whether the memory access instruction is to be replaced by vector invariant access code further includes determining whether the vectorization factor mod the modulo value is equal to zero. Determining whether the memory access instruction is to be replaced by vector invariant access code also includes determining whether the value at loop entry for the periodic induction variable used by the memory access instruction begins at zero. Determining whether the memory access instruction is to be replaced by vector invariant access code further includes that in response to the vector length being greater than or equal to the modulo value, the vector length mod the modulo value being equal to zero, and the iterations of the memory access instruction beginning at zero, determining that the memory access instruction is a candidate to be replaced by vector invariant access code. In an embodiment, determining whether the memory access instruction is to be replaced by vector modulo addressing access code includes determining whether the modulo is aligned at an access width of the memory access instruction.

According to another aspect, a method is disclosed in accordance with at least one embodiment of the present disclosure. The method includes detecting, by a compiler, a memory access instruction. The method also includes determining, by a vector invariant candidate detection module of the compiler, whether the memory access instruction is to be replaced by vector invariant access code. The method further includes that if the memory access instruction is to be replaced by vector invariant access code: marking the memory access instruction as a candidate to be replaced by vector invariant access code, generating first replacement code that vectorizes the memory access instruction using vector invariant access code, and replacing, by the compiler, the memory access instruction with the first replacement code. The method also includes that if the memory access instruction is not to be replaced by vector invariant access code, determining, by a vector modulo addressing candidate detection module of the compiler, whether the memory access instruction is to be replaced by vector modulo addressing access code. The method further includes that in response to determining that the memory access instruction is to be replaced by vector modulo addressing access code: marking the memory access instruction as a candidate to be replaced by vector modulo addressing access code; generating second replacement code that vectorizes the memory access instruction using vector modulo addressing code; and replacing, by the compiler, the memory access instruction with the second replacement code.

In an embodiment, the method further includes that generating the second replacement code that vectorizes the memory access instruction using vector modulo addressing code includes: adding a modulo addressing set code before vectorized code in the second replacement code; and adding a modulo addressing reset code after the vectorized code in the second replacement code. In an embodiment, the first replacement code includes simple vector access invariant code, and does not include a modulo operation from a loop instruction associated with the memory access instruction.

In an embodiment, the first replacement code includes extended vector access invariant code, and does not include a modulo operation from a loop instruction associated with the memory access instruction.

In an embodiment, determining whether the memory access instruction is to be replaced by vector invariant access code includes determining a modulo value of the memory access instruction. Determining whether the memory access instruction is to be replaced by vector invariant access code also includes determining whether a vector length is greater than or equal to the modulo value. Determining whether the memory access instruction is to be replaced by vector invariant access code further includes determining whether the vectorization factor mod the modulo value is equal to zero. Determining whether the memory access instruction is to be replaced by vector invariant access code also includes determining whether the value at loop entry for the periodic induction variable used by the memory access instruction begins at zero. Determining whether the memory access instruction is to be replaced by vector invariant access code further includes that in response to the vector length being greater than or equal to the modulo value, the vector length mod the modulo value being equal to zero, and the iterations of the memory access instruction beginning at zero, determining that the memory access instruction is a candidate to be replaced by vector invariant access code.

In an embodiment, determining whether the memory access instruction is to be replaced by vector modulo addressing access code includes determining whether the modulo is aligned at an access width of the memory access instruction. In an embodiment, determining whether the memory access instruction is to be replaced by vector modulo addressing access code further comprises: determining whether the accessed memory exceeds a buffer end; and marking the memory access instruction as a vector modulo addressing candidate in response to the accessed memory being less than the buffer end, other marking the memory access instruction as not a vector modulo addressing candidate.

According to another aspect, a processing device is disclosed in accordance with at least one embodiment of the present disclosure. The processing device includes a target processor instruction memory to store a plurality of memory access instructions. The processing device further includes a compiler to communicate with the target processor instruction memory. The compiler of the processing device includes a vector invariant candidate detection module to determine whether the memory access instruction is to be replaced by vector invariant access code. The compiler further includes a vector modulo addressing candidate detection module to determine whether the memory access instruction is to be replaced by vector modulo addressing access code. If the memory access instruction is to be replaced by vector invariant access code: the complier to generate first replacement code that vectorizes the memory access instruction using vector invariant access code, and to replace the memory access instruction with the first replacement code. If the memory access instruction is not to be replaced by vector invariant access code, in response to a determination that the memory access instruction is to be replaced by vector modulo addressing access code: to generate second replacement code that vectorizes the memory access instruction using vector modulo addressing code, and to replace the memory access instruction with the second replacement code.

In an embodiment, the complier further to add a modulo addressing set code before a loop instruction within the memory access instruction and to add a modulo addressing reset code after the loop instruction in response to the memory access instruction being a candidate to be replaced by vector modulo addressing access code. In an embodiment, the first replacement code includes simple vector access invariant code, and does not include a modulo operation from a loop instruction associated with the memory access instruction. In an embodiment, the first replacement code includes extended vector access invariant code, and does not include a modulo operation from a loop instruction associated with the memory access instruction.

In an embodiment, the vector invariant candidate detection module further to determine a vector length of the memory access instruction, determine a modulo value of the memory access instruction, to determine whether the vectorization factor is greater than or equal to the modulo value, to determine whether a vector length mod the modulo value is equal to zero, to determine whether iterations of the memory access instruction begins at zero, and in response to the vector length being greater than or equal to the modulo value, the vector length mod the modulo value being equal to zero, and the iterations of the memory access instruction beginning at zero, to determine that the memory access instruction is a candidate to be replaced by vector invariant access code.

In an embodiment, the vector modulo addressing candidate detection module further to determine whether the modulo is aligned at an access width of the memory access instruction, and to mark the memory access instruction as not a modulo addressing candidate in response to the modulo not being aligned with the access width. In an embodiment, the modulo addressing detection circuit further to determine whether memory accesses by the memory access instruction are to memory locations less than a buffer end, and to mark the memory access instruction as a vector modulo addressing candidate in response to the accessed memory being less than the buffer end, other marking the memory access instruction as not a modulo addressing candidate.

If the memory access instruction is not a candidate for vector modulo invariant, a determination is made whether the memory access is a candidate for vector modulo addressing at block 608. In an embodiment, this determination is made by the vector modulo addressing candidate detection module 114 of FIG. 1. If the memory access is not a candidate for vector modulo addressing, the flow continues as described above at block 602. If the memory access is a candidate for vector modulo addressing, the memory access instruction is vectorized, a modulo addressing initialization code and modulo addressing reset code are added to the memory access instruction, and the modulo operation is from the set of instructions at block 610.

Other embodiments, uses, and advantages of the disclosure will be apparent to those skilled in the art from consideration of the specification and practice of the disclosure disclosed herein. The specification and drawings should be considered as examples only, and the scope of the disclosure is accordingly intended to be limited only by the following claims and equivalents thereof. For example, one skilled in the art would appreciate that a data processing system, such as a computer having an instruction based data processor, can be used to implement the analysis described herein.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method comprising:
   detecting, by a compiler, a memory access instruction;
   determining, by a vector invariant candidate detection module of the compiler, whether the memory access instruction is to be replaced by vector invariant access code,
      wherein determining whether the memory access instruction is to be replaced by vector invariant access code comprises:
      determining a modulo value of the memory access instruction;
      determining whether a vector length is greater than or equal to the modulo value;
      determining whether the vectorization factor mod the modulo value is equal to zero;
      determining whether the value at loop entry for the periodic induction variable used by the memory access instruction begins at zero; and
      in response to the vector length being greater than or equal to the modulo value, the vector length mod the modulo value being equal to zero, and the iterations of the memory access instruction beginning at zero, determining that the memory access instruction is a candidate to be replaced by vector invariant access code;
   if the memory access instruction is to be replaced by vector invariant access code:
      generating first replacement code that vectorizes the memory access instruction using vector invariant access code; and
      replacing, by the compiler, the memory access instruction with the first replacement code;
   if the memory access instruction is not to be replaced by vector invariant access code, determining, by a vector modulo addressing candidate detection module of the compiler, whether the memory access instruction is to be replaced by vector modulo addressing access code; and
   in response to determining that the memory access instruction is to be replaced by vector modulo addressing access code:
      generating second replacement code that vectorizes the memory access instruction using vector modulo addressing code; and replacing, by the compiler, the memory access instruction with the second replacement code.

2. The method of claim 1, wherein generating the second replacement code that vectorizes the memory access instruction using vector modulo addressing code comprises:
adding a modulo addressing set code before vectorized code in the second replacement code; and
adding a modulo addressing reset code after the vectorized code in the second replacement code.

3. The method of claim 1, wherein the first replacement code includes simple vector access invariant code, and does not include a modulo operation from a loop instruction associated with the memory access instruction.

4. The method of claim 1, wherein the first replacement code includes extended vector access invariant code, and does not include a modulo operation from a loop instruction associated with the memory access instruction.

5. The method of claim 1, wherein determining whether the memory access instruction is to be replaced by vector modulo addressing access code comprises:
determining whether the modulo is aligned at an access width of the memory access instruction.

6. A method comprising:
detecting, by a compiler, a memory access instruction;
determining, by a vector invariant candidate detection module of the compiler, whether the memory access instruction is to be replaced by vector invariant access code,
wherein determining whether the memory access instruction is to be replaced by vector invariant access code comprises:
determining a modulo value of the memory access instruction;
determining whether a vector length is greater than or equal to the modulo value;
determining whether the vectorization factor mod the modulo value is equal to zero;
determining whether the value at loop entry for the periodic induction variable used by the memory access instruction begins at zero; and
in response to the vector length being greater than or equal to the modulo value, the vector length mod the modulo value being equal to zero, and the iterations of the memory access instruction beginning at zero, determining that the memory access instruction is a candidate to be replaced by vector invariant access code;
if the memory access instruction is to be replaced by vector invariant access code:
marking the memory access instruction as a candidate to be replaced by vector invariant access code;
generating first replacement code that vectorizes the memory access instruction using vector invariant access code; and
replacing, by the compiler, the memory access instruction with the first replacement code;
if the memory access instruction is not to be replaced by vector invariant access code, determining, by a vector modulo addressing candidate detection module of the compiler, whether the memory access instruction is to be replaced by vector modulo addressing access code; and
in response to determining that the memory access instruction is to be replaced by vector modulo addressing access code:

marking the memory access instruction as a candidate to be replaced by vector modulo addressing access code;
generating second replacement code that vectorizes the memory access instruction using vector modulo addressing code; and
replacing, by the compiler, the memory access instruction with the second replacement code.

7. The method of claim 6, wherein generating the second replacement code that vectorizes the memory access instruction using vector modulo addressing code comprises:
adding a modulo addressing set code before vectorized code in the second replacement code; and
adding a modulo addressing reset code after the vectorized code in the second replacement code.

8. The method of claim 6, wherein the first replacement code includes simple vector access invariant code, and does not include a modulo operation from a loop instruction associated with the memory access instruction.

9. The method of claim 6, wherein the first replacement code includes extended vector access invariant code, and does not include a modulo operation from a loop instruction associated with the memory access instruction.

10. The method of claim 6, wherein determining whether the memory access instruction is to be replaced by vector modulo addressing access code comprises:
determining whether the modulo is aligned at an access width of the memory access instruction.

11. The method of claim 10, wherein determining whether the memory access instruction is to be replaced by vector modulo addressing access code further comprises:
determining whether the accessed memory exceeds a buffer end; and
marking the memory access instruction as a vector modulo addressing candidate in response to the accessed memory being less than the buffer end, other marking the memory access instruction as not a vector modulo addressing candidate.

12. A processing device comprises:
a target processor instruction memory to store a plurality of memory access instructions; and
a compiler to communicate with the target processor instruction memory, the compiler including:
a hardware vector invariant candidate detection module to determine whether the memory access instruction is to be replaced by vector invariant access code, to determine a vector length of the memory access instruction, determine a modulo value of the memory access instruction, to determine whether the vectorization factor is greater than or equal to the modulo value, to determine whether a vector length mod the modulo value is equal to zero, to determine whether iterations of the memory access instruction begins at zero, and in response to the vector length being greater than or equal to the modulo value, the vector length mod the modulo value being equal to zero, and the iterations of the memory access instruction beginning at zero, to determine that the memory access instruction is a candidate to be replaced by vector invariant access code;
a hardware vector modulo addressing candidate detection module to determine whether the memory access instruction is to be replaced by vector modulo addressing access code;
if the memory access instruction is to be replaced by vector invariant access code: the compiler to generate first replacement code that vectorizes the memory access instruction using vector invariant access code, and to replace the memory access instruction with the first replacement code; and if the memory access instruction is not to be replaced by vector invariant access code, in response to a determination that the memory access instruction is to be replaced by vector modulo addressing access code: to generate second replacement code that vectorizes the memory access instruction using vector modulo addressing code, and to replace the memory access instruction with the second replacement code.

13. The processing device of claim 12, wherein the compiler further to add a modulo addressing set code before a loop instruction within the memory access instruction and to add a modulo addressing reset code after the loop instruction in response to the memory access instruction being a candidate to be replaced by vector modulo addressing access code.

14. The processing device of claim 12, wherein the first replacement code includes simple vector access invariant code, and does not include a modulo operation from a loop instruction associated with the memory access instruction.

15. The processing device of claim 12, wherein the first replacement code includes extended vector access invariant code, and does not include a modulo operation from a loop instruction associated with the memory access instruction.

16. The processing device of claim 12, the hardware vector modulo addressing candidate detection module further to determine whether the modulo is aligned at an access width of the memory access instruction, and to mark the memory access instruction as not a modulo addressing candidate in response to the modulo not being aligned with the access width.

17. The processing device of claim 16, the modulo addressing detection circuit further to determine whether memory accesses by the memory access instruction are to memory locations less than a buffer end, and to mark the memory access instruction as a vector modulo addressing candidate in response to the accessed memory being less than the buffer end, other marking the memory access instruction as not a modulo addressing candidate.

* * * * *